United States Patent
Jang et al.

(10) Patent No.: US 7,557,668 B2
(45) Date of Patent: Jul. 7, 2009

(54) INJECTION-LOCKED FREQUENCY DIVIDER

(75) Inventors: Sheng-Lyang Jang, Taipei (TW); Yun-Hsueh Chuang, Taoyuan County (JP); Ren-Hong Yen, Taipei (TW); Shao-Hwa Lee, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 146 days.

(21) Appl. No.: 11/561,417

(22) Filed: Nov. 19, 2006

(65) Prior Publication Data

US 2008/0074199 A1 Mar. 27, 2008

(30) Foreign Application Priority Data

Sep. 27, 2006 (TW) .............................. 95135751 A

(51) Int. Cl.
*H03B 5/081* (2006.01)
(52) U.S. Cl. .............. 331/167; 331/117 R; 331/117 FE; 331/177 V
(58) Field of Classification Search ........... 331/116 FE, 331/116 R, 167, 117 R, 117 FE, 177 V
See application file for complete search history.

(56) References Cited

U.S. PATENT DOCUMENTS 6,249,192 B1 * 6/2001 Gabara et al. ........... 331/117 R

OTHER PUBLICATIONS

"A Wide Locking Range and Low Voltage CMOS Direct Injection-Locked Frequency Divider", Y.-H. Chuang, S.-H. Lee, R.-H. Yen, S.-L. Jang, J.-F. Lee, and M.-H. Juang, IEEE Microwave and Wireless Components Letters, vol. 16, No. 5, May 2006, pp. 299-301.

"A CMOS direct injection-locked oscillator topology as high-frequency low-power frequency divider", Marc Tiebout, IEEE Journal of Solid-State Circuits, Publication Date: Jul. 2004, vol. 39, No. 7, pp. 1170-1174.

"A 0.35-V 1.46-mW low-phase-noise oscillator with transformer feedback in standard 0.18-μm CMOS process", Kachun Kwok and Howard C. Luong, Custom Integrated Circuits Conference, 2003. Proceedings of the IEEE 2003, Publication Date: Sep. 21-24, 2003, pp. 551-554.

* cited by examiner

*Primary Examiner*—Arnold Kinkead
(74) *Attorney, Agent, or Firm*—Jianq Chyun IP Office

(57) ABSTRACT

An injection-locked frequency divider is provided. The injection-locked frequency divider includes a variable reactance unit, a signal injection unit, a first switch, a second switch, a first transformer, and a second transformer. The variable reactance unit, the first switch, the second switch, the first transformer, and the second transformer form a transformer-based LC-tank oscillator. The signal injection unit receives an injection signal. When the injection-locked frequency divider is in a locked state, the transformer-based LC-tank oscillator outputs a frequency division signal. Employing the feedback action of the first transformer and the second transformer, the present invention not only has a wide locking range but also promotes the realization of the low operating voltage.

35 Claims, 11 Drawing Sheets

INJECTION-LOCKED FREQUENCY DIVIDER

CROSS-REFERENCE TO RELATED APPLICATION

This application claims the priority benefit of Taiwan application serial no. 95135751, filed on Sep. 27, 2006. All disclosure of the Taiwan application is incorporated herein by reference.

BACKGROUND OF THE INVENTION

1. Field of the Invention

The present invention relates to an injection-locked frequency divider. More particularly, the present invention relates to an injection-locked frequency divider with an increased locking range by the use of a feedback action of transformers.

2. Description of Related Art

Frequency dividers have been widely applied in mixed signal integrated circuits, for example, crucial elements of multiplexers, phase locked loops, and frequency synthesizers. In recent years, in response to the requirements of consumers and the changes of systems technologies, an injection-locked frequency divider from among various kinds of frequency dividers attracts more attention due to its applicability in the operation of a high-speed system.

FIG. 1 is a schematic structural view of a conventional injection-locked frequency divider. Referring to FIG. 1, the conventional injection-locked frequency divider 100 is constructed by an LC-tank oscillator 110 and a signal injection unit 120. The signal injection unit 120 receives an injection signal $S_{IN1}$. The LC-tank oscillator 110 adjusts its oscillation frequency through a reactance control signal $S_{IP1}$. When the oscillation frequency of the LC-tank oscillator 110 approaches one half of the frequency of the injection signal $S_{IN1}$, the conventional injection-locked frequency divider 100 is in a locked state and a frequency division signal $S_{D1}$ is generated. Since the LC-tank oscillator 110 has a high oscillation frequency, the conventional injection-locked frequency divider 100 is applicable in a high-speed system. However, since the LC-tank oscillator 110 cannot provide a wide oscillation frequency range, the locking range of the conventional injection-locked frequency divider 100 is limited, thereby affecting the application range of the conventional injection-locked frequency divider 100 in practice.

FIG. 2 is a schematic structural view of another conventional injection-locked frequency divider. Referring to FIG. 2, the conventional injection-locked frequency divider 200 is constructed by an LC-tank oscillator 210 and a signal injection unit 220. Similarly, the signal injection unit 220 also receives an injection signal $S_{IN2}$. The LC-tank oscillator 210 adjusts its oscillation frequency through a reactance control signal $S_{IP2}$. When the oscillation frequency of the LC-tank oscillator 210 approaches one half of the frequency of the injection signal $S_{IN2}$, the conventional injection-locked frequency divider 200 is in the locked state and a frequency division signal $S_{DI2}$ is generated. However, in high-frequency operation, an injection current $I_2$ is diminished by the parasitic capacitance in the signal injection unit 220. Therefore, in practical application, the signal injection unit 220 must provide a larger injection current $I_2$ to maintain the primary characteristics of the conventional injection-locked frequency divider 200.

FIG. 3 is a schematic structural view of still another conventional injection-locked frequency divider. Referring to FIG. 3, the conventional injection-locked frequency divider 300 comprises an LC-tank oscillator 310, a signal injection unit 320, and a current-limiting unit 330. Similarly, in a locked state, the injection-locked frequency divider 300 generates a frequency division signal $S_{DI3}$ through the LC-tank oscillator 310. In order to solve the defects of the conventional injection-locked frequency divider 200, the conventional injection-locked frequency divider 300 receives an injection signal $S_{IN3}$ through the signal injection unit 320. In another aspect, under the circumstance that an injection current $I_3$ is controlled by the current-limiting unit 330, the power consumption of the conventional injection-locked frequency divider 300 is efficiently limited. The LC-tank oscillator 310 adjusts its oscillation frequency through a reactance control signal $S_{IP3}$ and the current-limiting unit 330 adjusts and controls the injection current $I_3$ according to a bias current control signal $S_{BI3}$. However, the conventional injection-locked frequency divider 300 still has the problem of a narrow locking range.

In view of the above, in the practical application, the conventional injection-locked frequency divider has the problems of narrow locking range and high power consumption. In other words, the conventional injection-locked frequency divider cannot be widely used in various mixed signal integrated circuits due to such problems.

SUMMARY OF THE INVENTION

Accordingly, the present invention is directed to an injection-locked frequency divider with an increased locking range of its circuit by the use of the feedback action of transformers.

The present invention provides an injection-locked frequency divider, which is used to perform a frequency division action on an injection signal to generate a frequency division signal. The injection-locked frequency divider comprises a variable reactance unit, a signal injection unit, a first switch, a second switch, a first transformer, and a second transformer. In the aspect of overall operation, the variable reactance unit, the first switch, the second switch, the first transformer, and the second transformer construct a transformer-based LC-tank oscillator. The signal injection unit receives the injection signal. When the injection-locked frequency divider is in a locked state, the transformer-based LC-tank oscillator outputs the frequency division signal through a first connecting terminal and a second connecting terminal.

It should be noted that the first switch and the second switch are cross-coupled. The primary-side coil of the first transformer is coupled between the first connecting terminal and a ground terminal, and the secondary-side coil of the first transformer is coupled between the second terminal of the first switch and an operating voltage. The primary-side coil of the second transformer is coupled between the second connecting terminal and the ground terminal, and the secondary-side coil of the second transformer is coupled between the second terminal of the second switch and the operating voltage.

Furthermore, the present invention further provides an injection-locked frequency divider, which is used to perform a frequency division action on an injection signal to generate a frequency division signal. The injection-locked frequency divider comprises a variable reactance unit, a signal injection unit, a first switch, a second switch, a first transformer, and a second transformer. In the aspect of overall operation, the variable reactance unit, the first switch, the second switch, the first transformer, and the second transformer construct a transformer-based LC-tank oscillator. The signal injection unit receives the injection signal. When the injection-locked frequency divider is in a locked state, the transformer-based LC-tank oscillator outputs the frequency division signal through a first connecting terminal and a second connecting terminal.

It should be noted that the first switch and the second switch are cross-coupled. The primary-side coil of the first transformer is coupled between the first connecting terminal and a ground terminal, and the secondary-side coil of the first transformer is coupled between the control terminal of the first switch and the second connecting terminal. The primary-side coil of the second transformer is coupled between the second connecting terminal and the ground terminal, and the secondary-side coil of the second transformer is coupled between the control terminal of the second switch and the first connecting terminal.

Furthermore, the present invention provides an injection-locked frequency divider, which is used to perform a frequency division action on an injection signal to generate a frequency division signal. The injection-locked frequency divider comprises a variable reactance unit, a signal injection unit, a first P-type transistor, a second P-type transistor, a first transformer, and a second transformer. In the aspect of overall operation, the variable reactance unit, the first P-type transistor, the second P-type transistor, the first transformer, and the second transformer construct a transformer-based LC-tank oscillator. The signal injection unit receives the injection signal. When the injection-locked frequency divider is in a locked state, the transformer-based LC-tank oscillator outputs the frequency division signal through a first connecting terminal and a second connecting terminal.

It should be noted that in the overall architecture, the first P-type transistor and the second P-type transistor are cross-coupled. The primary-side coil of the first transformer is coupled between the first connecting terminal and a ground terminal, and the secondary-side coil of the first transformer is coupled between the base of the first P-type transistor and an operational voltage. The primary-side coil of the second transformer is coupled between the second connecting terminal and the ground terminal, and the secondary-side coil of the second transformer is coupled between the base of the second P-type transistor and the operational voltage.

According to another aspect of the present invention, an injection-locked frequency divider is provided, which is used to perform a frequency division action on an injection signal to generate a frequency division signal. The injection-locked frequency divider comprises a variable reactance unit, a signal injection unit, a first switch, a second switch, a first transformer, and a second transformer. In the aspect of overall operation, the variable reactance unit, the first switch, the second switch, the first transformer, and the second transformer construct a transformer-based LC-tank oscillator. The signal injection unit receives the injection signal. When the injection-locked frequency divider is in a locked state, the transformer-based LC-tank oscillator outputs the frequency division signal.

It should be noted that the transformer-based LC-tank oscillator is derived from two single ended Armstrong oscillators. Therefore, in the overall architecture, the primary-side coil of the first transformer is coupled between the first terminal of the first switch and a ground terminal, and the secondary-side coil of the first transformer is coupled between the control terminal of the first switch and the ground terminal. The primary-side coil of the second transformer is coupled between the first terminal of the second switch and the ground terminal, and the secondary-side coil of the second transformer is coupled between the control terminal of the second switch and the ground terminal.

In view of the above, the injection-locked frequency divider of the present invention employs transformers coupled in various manners. Therefore, by employing the feedback action of the transformers, the injection-locked frequency divider of the present invention not only has a wide locking range but also promotes the application in various mixed signal integrated circuits.

In order to the make aforementioned and other objects, features and advantages of the present invention comprehensible, preferred embodiments accompanied with figures are described in detail below.

DESCRIPTION OF EMBODIMENTS

The main technical features of the present invention involve using transformers coupled in various manners to increase the locking range of an injection-locked frequency divider. The injection-locked frequency divider of the present invention will be described in the following embodiments. However, it is known that these embodiments are not intended to limit the present invention. Those skilled in the art can make some modifications to the following embodiments without departing from the spirit and scope of the present invention, and the modifications still fall within the scope of the present invention.

Figure 1:
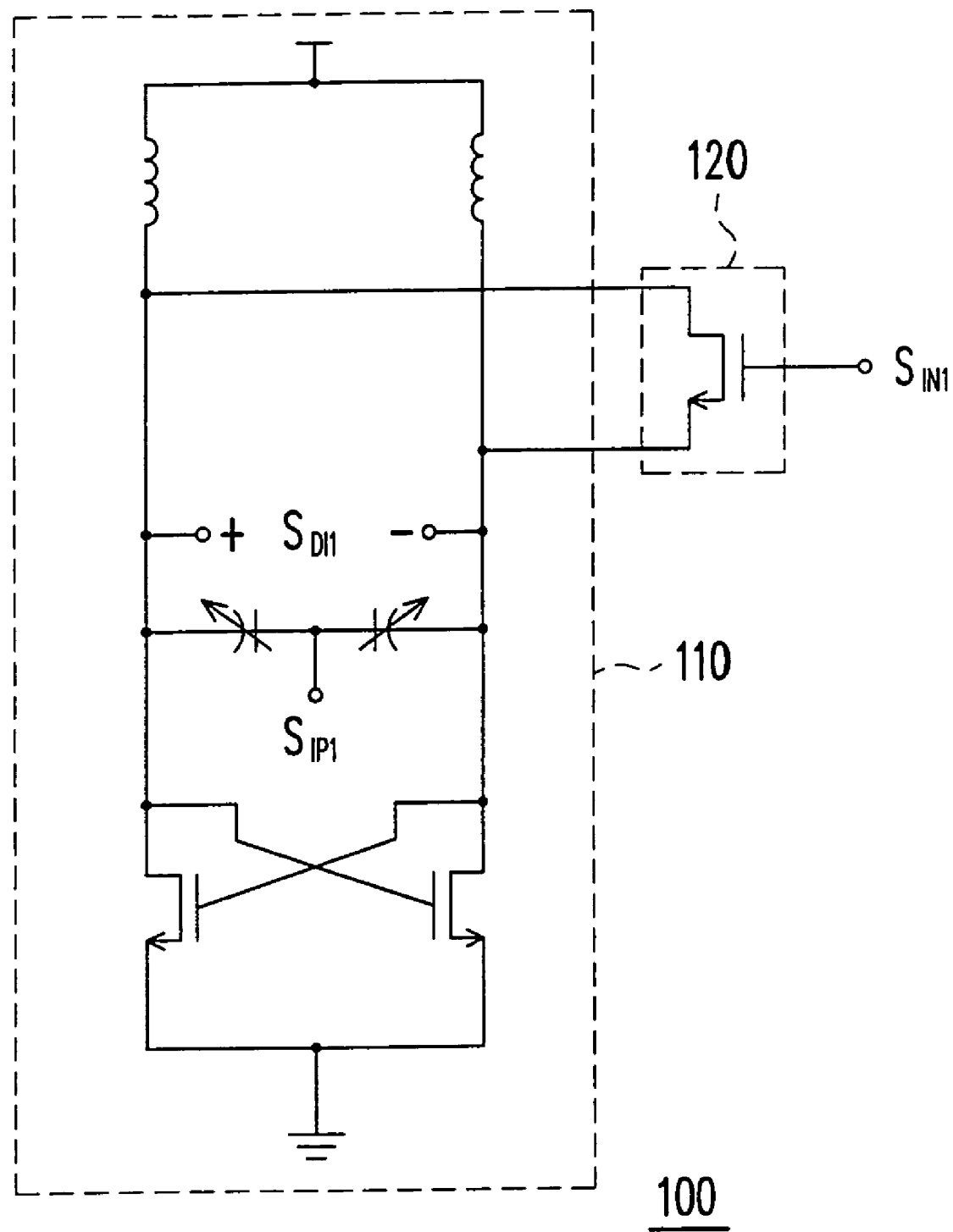
FIG. 1 is a schematic structural view of a conventional injection-locked frequency divider.
Figure 2:
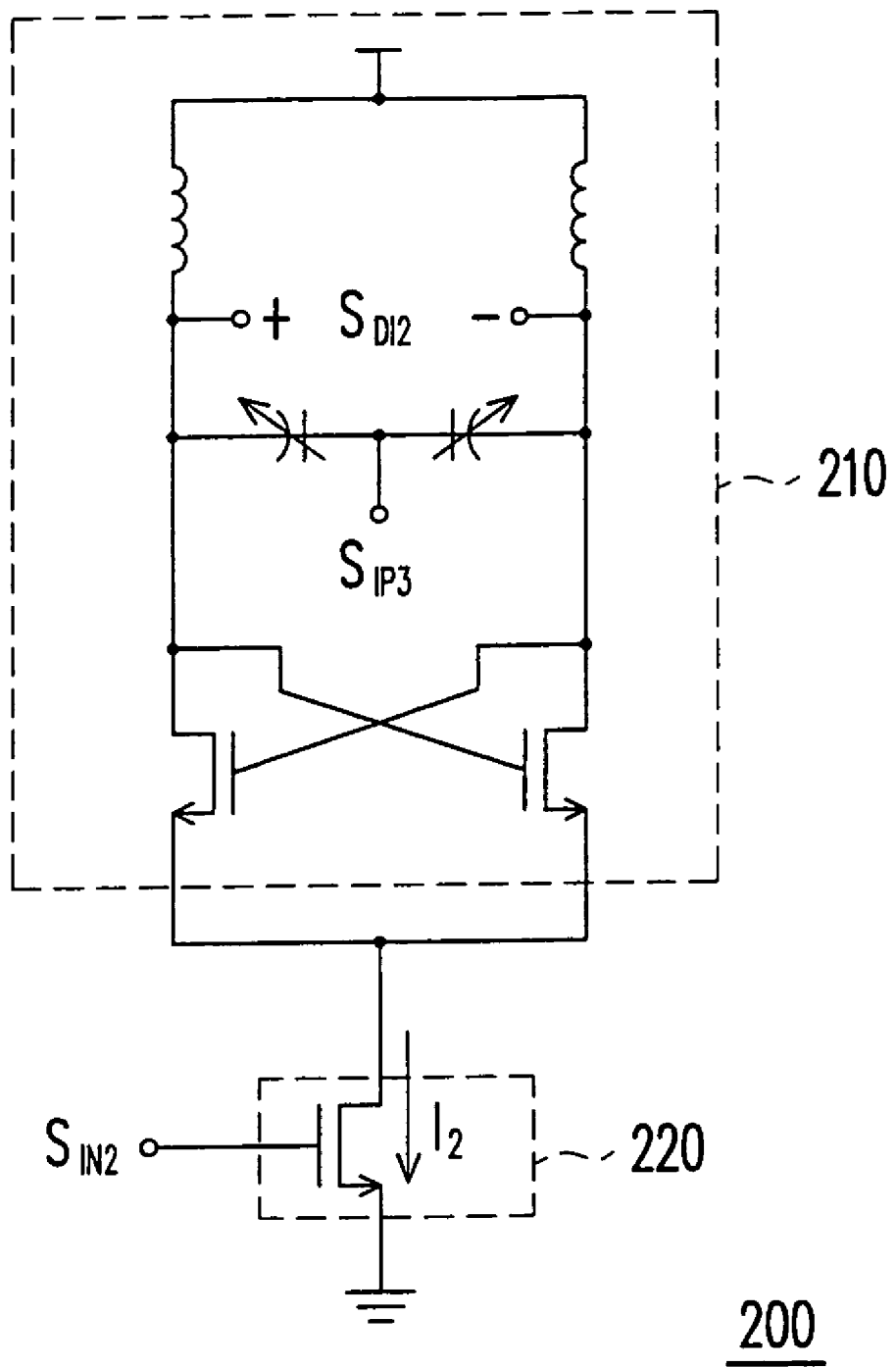
FIG. 2 is a schematic structural view of another conventional injection-locked frequency divider.
Figure 3:
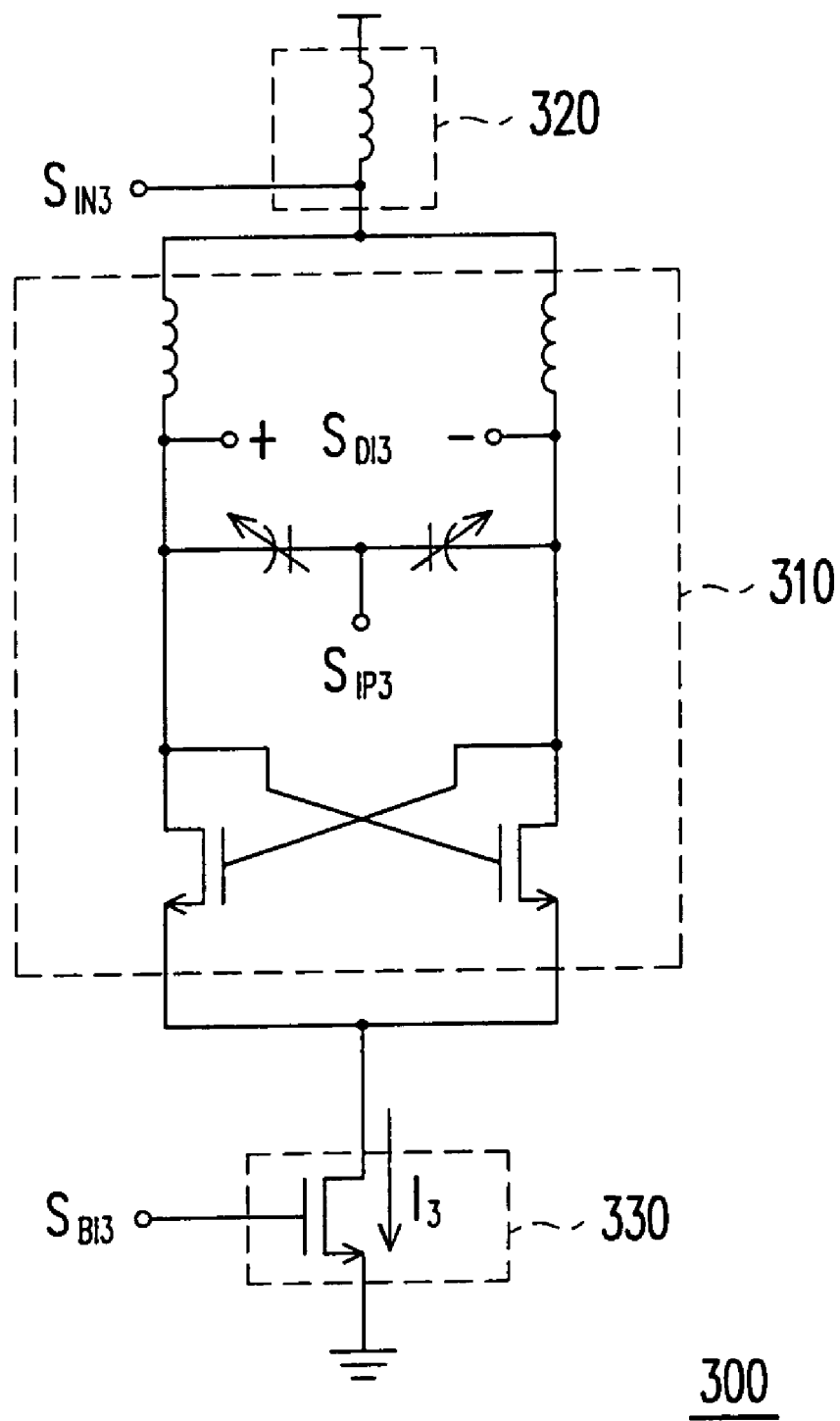
FIG. 3 is a schematic structural view of still another conventional injection-locked frequency divider.
Figure 4:
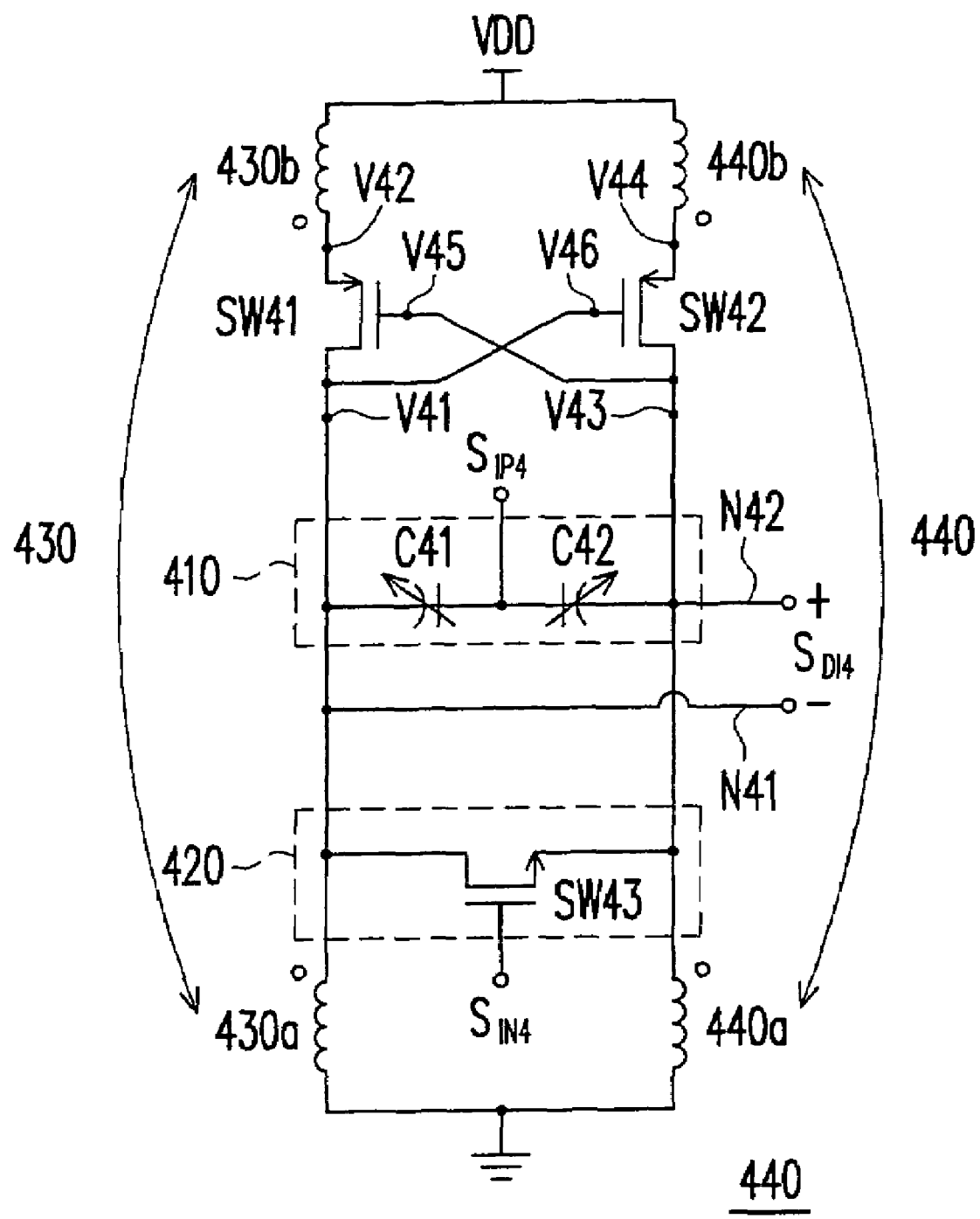
FIG. 4 is a schematic structural view of an injection-locked frequency divider according to an embodiment of the present invention.

FIG. 4 is a schematic structural view of an injection-locked frequency divider according to an embodiment of the present invention. Referring to FIG. 4, the injection-locked frequency divider 400 includes a variable reactance unit 410, a signal injection unit 420, switches SW41 and SW42, and transformers 430 and 440. The variable reactance unit 410 has connecting terminals N41 and N42. The signal injection unit 420 is coupled to the connecting terminals N41 and N42. A first terminal of the switch SW41 is coupled to the connecting terminal N41 and a control terminal of the switch SW41 is coupled to the connecting terminal N42. A first terminal of the switch SW42 is coupled to the connecting terminal N42 and a control terminal of the switch SW42 is coupled to the connecting terminal N41. A primary-side coil 430a of the transformer 430 is coupled between the connecting terminal N41 and a ground terminal, and a secondary-side coil 430b of the transformer 430 is coupled between a second terminal of the switch SW41 and an operating voltage $V_{DD}$. A primary-side coil 440a of the transformer 440 is coupled between the connecting terminal N42 and the ground terminal, and a secondary-side coil 440b of the transformer 440 is coupled between a second terminal of the switch SW42 and the operating voltage $V_{DD}$.

Furthermore, the variable reactance unit 410 includes variable capacitors C41 and C42, and the signal injection unit 420 includes a switch SW43. A first terminal of the variable capacitor C41 is coupled to the connecting terminal N41, a first terminal of the variable capacitor C42 is coupled to the connecting terminal N42, and a second terminal of the variable capacitor C41 and a second terminal of the variable capacitor C42 are coupled with each other. Additionally, a first terminal of the switch SW43 is coupled to the connecting terminal N41 and a second terminal is coupled to the connecting terminal N42.

It should be noted that the switches SW41 and SW42 respectively includes a P-type transistor, and the switch SW43 includes an N-type transistor. However, the architecture of the switches SW41-SW43 is not limited there-to and those skilled in the art can replace the switches SW41-SW43 with other equivalent elements as required to achieve the purpose of the present invention, which shall also construed to be within the scope of the present invention.

Referring to FIG. 4, in the aspect of the overall operation mechanism, the variable reactance unit 410, the switches SW41 and SW42, and the transformers 430 and 440 construct a transformer-based LC-tank oscillator. A resonator of the transformer-based LC-tank oscillator is constructed by the variable reactance unit 410 and the transformers 430 and 440. The switches SW41 and SW42 are cross-coupled to provide a negative resistance. Here, the negative resistance provided by the switches SW41 and SW42 compensates the parasitic resistance in the resonator, such that the transformer-based LC-tank oscillator maintains oscillation. In another aspect, a second terminal of the variable capacitor C41 receives a reactance control signal $S_{IP4}$. Thus, the variable reactance unit 410 adjusts its reactance value according to the reactance control signal $S_{IP4}$, such that the oscillation frequency of the transformer-based LC-tank oscillator changes accordingly.

During the generation of a frequency division signal $S_{DI4}$, the injection-locked frequency divider 400 receives an injection signal $S_{IN4}$ through the signal injection unit 420, wherein the frequency of the injection signal $S_{IN4}$ is denoted by $f_4$. When the oscillation frequency of the transformer-based LC-tank oscillator approaches one half of the frequency $f_4$, the injection-locked frequency divider 400 is in a locked state and the frequency division signal $S_{DI4}$ is output through the connecting terminals N41 and N42, wherein the frequency of the frequency division signal $S_{DI4}$ is one half of the frequency $f_4$.

It should be noted that the injection-locked frequency divider 400 can increase the locking range of its circuit by using the feedback action formed by the transformers 430 and 440. Furthermore, under the feedback action of the transformers 430 and 440, a node voltage V41 and a node voltage V42 are of the same phase, and a node voltage V43 and a node voltage V44 are of the same phase. In other words, when a node voltage V45 decreases, the node voltages V41 and V42 rise accordingly. Similarly, when a node voltage V46 decreases, the node voltages V43 and V44 rise accordingly. In this manner, the feedback action of the transformers 430 and 440 will efficiently improve the amplitude of the frequency division signal $S_{DI4}$, thus promoting the injection-locked frequency divider 400 operating at a lower operating voltage $V_{DD}$.

According to the embodiment described in FIG. 4, different types of injection-locked frequency dividers are derived from the injection-locked frequency divider 400, and the details will be described one by one as follows.

Figure 5:
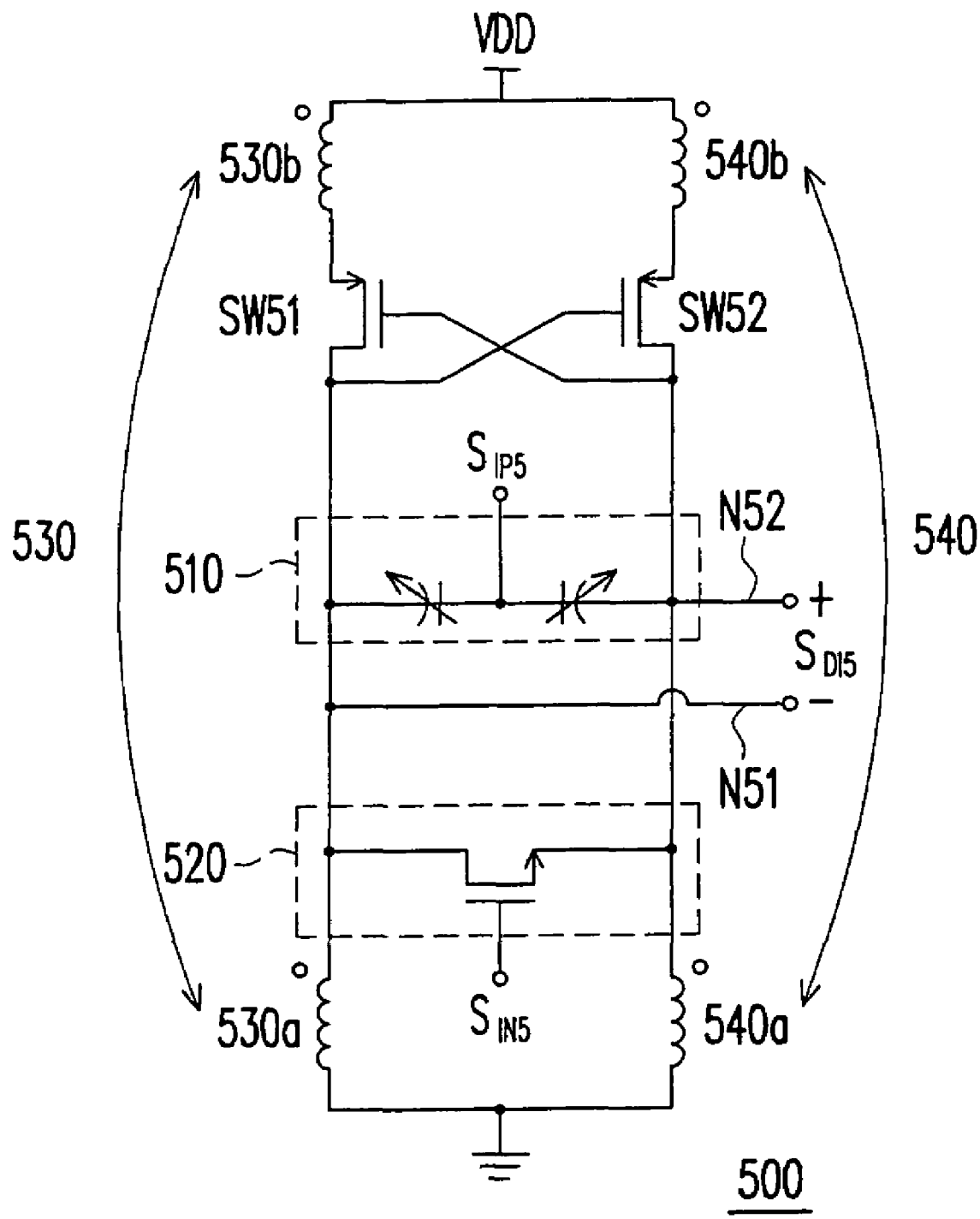
FIG. 5 is a schematic structural view of an injection-locked frequency divider derived from the embodiment of FIG. 4.

FIG. 5 is a schematic structural view of an injection-locked frequency divider derived from the embodiment of FIG. 4. Referring to FIG. 5, the injection-locked frequency divider 500 includes a variable reactance unit 510, a signal injection unit 520, switches SW51 and SW52, and transformers 530 and 540. The variable reactance unit 510 has connecting terminals N51 and N52. The signal injection unit 520 is coupled to the connecting terminals N51 and N52. A first terminal of the switch SW51 is coupled to the connecting terminal N51 and a control is coupled to the connecting terminal N52. A first terminal of the switch SW52 is coupled to the connecting terminal N52 and a control terminal of the switch SW52 is coupled to the connecting terminal N51.

Furthermore, a primary-side coil 530a of the transformer 530 is coupled between the connecting terminal N51 and a ground terminal, a secondary-side coil 530b of the transformer 530 is coupled between a second terminal of the switch SW51 and an operating voltage $V_{DD}$. A primary-side coil 540a of the transformer 540 is coupled between the connecting terminal N52 and the ground terminal, and a secondary-side coil 540b of the transformer 540 is coupled between a second terminal of the switch SW52 and the operating voltage $V_{DD}$. The details of the architecture and couple relationships of other means are similar to those in the embodiment of FIG. 4 and will not be described herein again.

Referring to FIGS. 4 and 5, the injection-locked frequency dividers 500 and 400 have substantially the same operating principle. The variable reactance unit 510, the switches SW51 and SW52, and the transformers 530 and 540 construct a transformer-based LC-tank oscillator. The oscillation frequency of the transformer-based LC-tank oscillator changes along with a reactance control signal $S_{IP5}$. When the injection-locked frequency divider 500 is in the locked state, the connecting terminals N51 and N52 output a frequency division signal $S_{DI5}$, and at this time, the frequency of the frequency division signal $S_{DI5}$ is one half of the frequency of an injection signal $S_{IN5}$.

However, the main difference between the injection-locked frequency dividers 500 and 400 lies in that the secondary-side coil 430b of the transformer 430 and the secondary-side coil 530b of the transformer 530 have opposite voltage polarities and the secondary-side coil 440b of the transformer 440 and the secondary-side coil 540b of the transformer 540 have opposite voltage polarities. Under this state, the injection-locked frequency divider 500 can increase the locking range of its circuit still by using the feedback action of the transformers 530 and 540. However, different from the injection-locked frequency divider 400, the feedback action of the transformers 530 and 540 is a negative feedback mechanism. Therefore, under the feedback action of the transformers 530 and 540, the amplitude of the frequency division signal $S_{DI5}$ decreases accordingly, so as to promote alleviating the distortion of its waveform. Other details of the embodiment in FIG. 5 have been illustrated in the embodiment in FIG. 4, and will not be described herein again.

Figure 6:
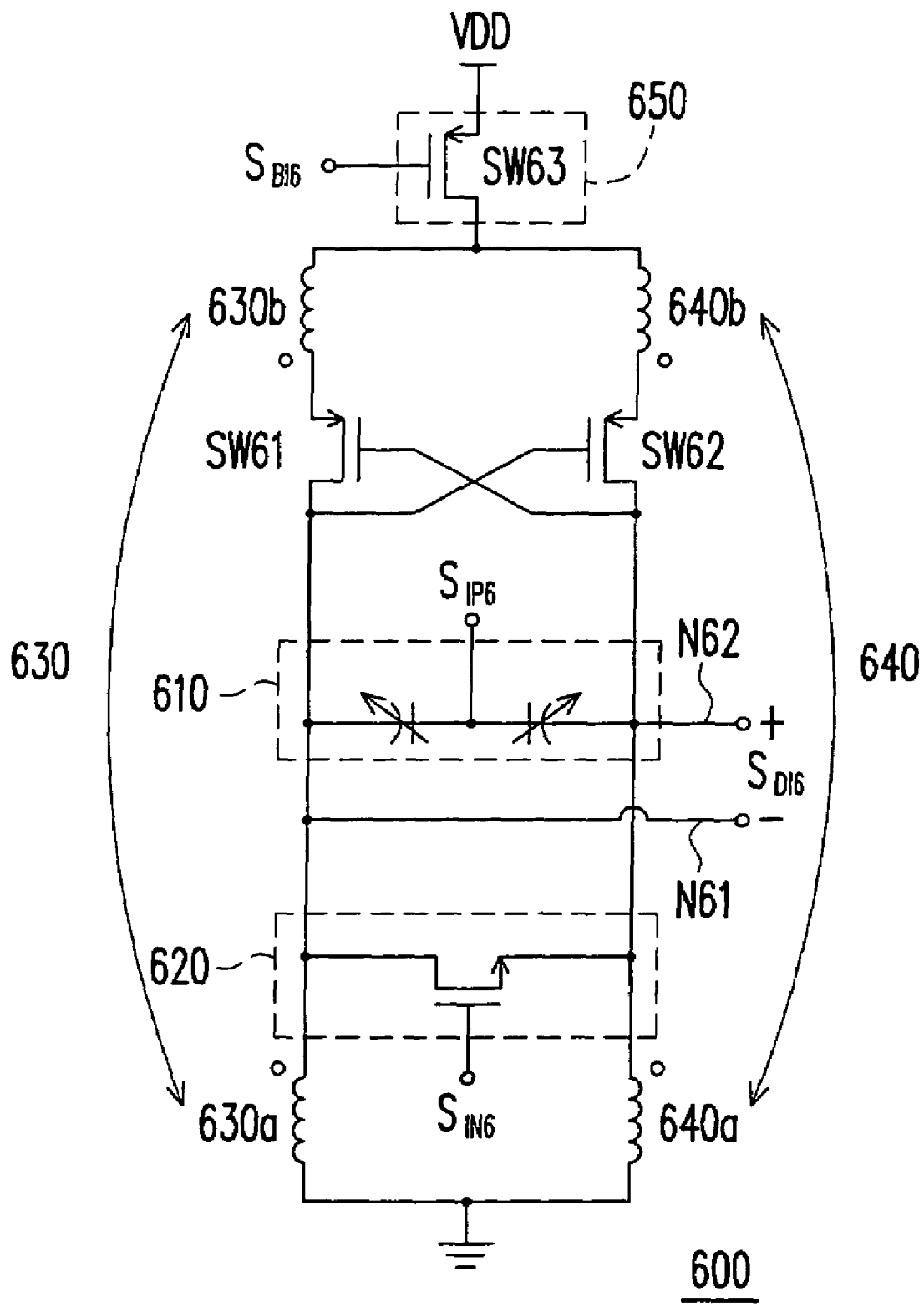
FIG. 6 is a schematic structural view of another injection-locked frequency divider derived from the embodiment of FIG. 4.

FIG. 6 is a schematic structural view of another injection-locked frequency divider derived from the embodiment of FIG. 4. Referring to FIG. 6, the injection-locked frequency divider 600 includes a variable reactance unit 610, a signal injection unit 620, switches SW61 and SW62, transformers 630 and 640, and a current-limiting unit 650. The variable reactance unit 610 has connecting terminals N61 and N62. The signal injection unit 620 is coupled to the connecting terminals N61 and N62. A first terminal of the switch SW61 is coupled to the connecting terminal N61 and a control terminal of the switch SW61 is coupled to the connecting terminal N62. A first terminal of the switch SW62 is coupled to the connecting terminal N62, and a control terminal of the switch SW62 is coupled to the connecting terminal N61.

Furthermore, a primary-side coil 630a of the transformer 630 is coupled between the connecting terminal N61 and a ground terminal, and a secondary-side coil 630b of the transformer 630 is coupled between a second terminal of the switch SW61 and the current-limiting unit 650. A primary-side coil 640a of the transformer 640 is coupled between the connecting terminal N62 and the ground terminal, and a secondary-side coil 640b of the transformer 640 is coupled between a second terminal of the switch SW62 and the current-limiting unit 650. The current-limiting unit 650 is coupled to the operating voltage $V_{DD}$, the secondary-side coil 630b of the transformer 630, and the secondary-side coil 640b of the transformer 640.

Furthermore, the current-limiting unit 650 includes a switch SW63. A first terminal of the switch SW63 is coupled to the secondary-side coils 630b and 640b, the second terminal of the switch SW63 is coupled to the operating voltage $V_{DD}$, and the control terminal of the switch SW63 is used to receive a bias current control signal $S_{BI6}$. It should be noted that the switch SW61 includes a P-type transistor, and the architecture of the switch SW61 will not be limited to this. Those skilled in the art can replace the switch SW61 with other elements in accordance with the design requirements. The details of the architecture and coupling relationship of other means are similar to those in the embodiment of FIG. 4 and will not be repeated.

Referring to FIGS. 4 and 6, the injection-locked frequency dividers 600 and 400 have substantially the same operating principles. The variable reactance unit 610, the switches SW61 and SW62, and the transformers 630 and 640 construct a transformer-based LC-tank oscillator. The oscillation frequency of the transformer-based LC-tank oscillator changes along with a reactance control signal $S_{IP6}$. When the injection-locked frequency divider 600 is in the locked state, the connecting terminals N61 and N62 output a frequency division signal $S_{DI6}$, and at this time, the frequency of the frequency division signal $S_{DI6}$ is one half of the frequency of an injection signal $S_{IN6}$.

The main difference between the injection-locked frequency dividers 600 and 400 lies in that the injection-locked frequency divider 600 further has the current-limiting unit 650. Here, the current-limiting unit 650 adjusts and controls a current flowing through the injection-locked frequency divider 600 according to the bias current control signal $S_{BI6}$. In this manner, the power consumption of the injection-locked frequency divider 600 can be efficiently reduced. Other details of the embodiment in FIG. 6 have been illustrated in the embodiment in FIG. 4, and will not be described repeated.

Figure 7:
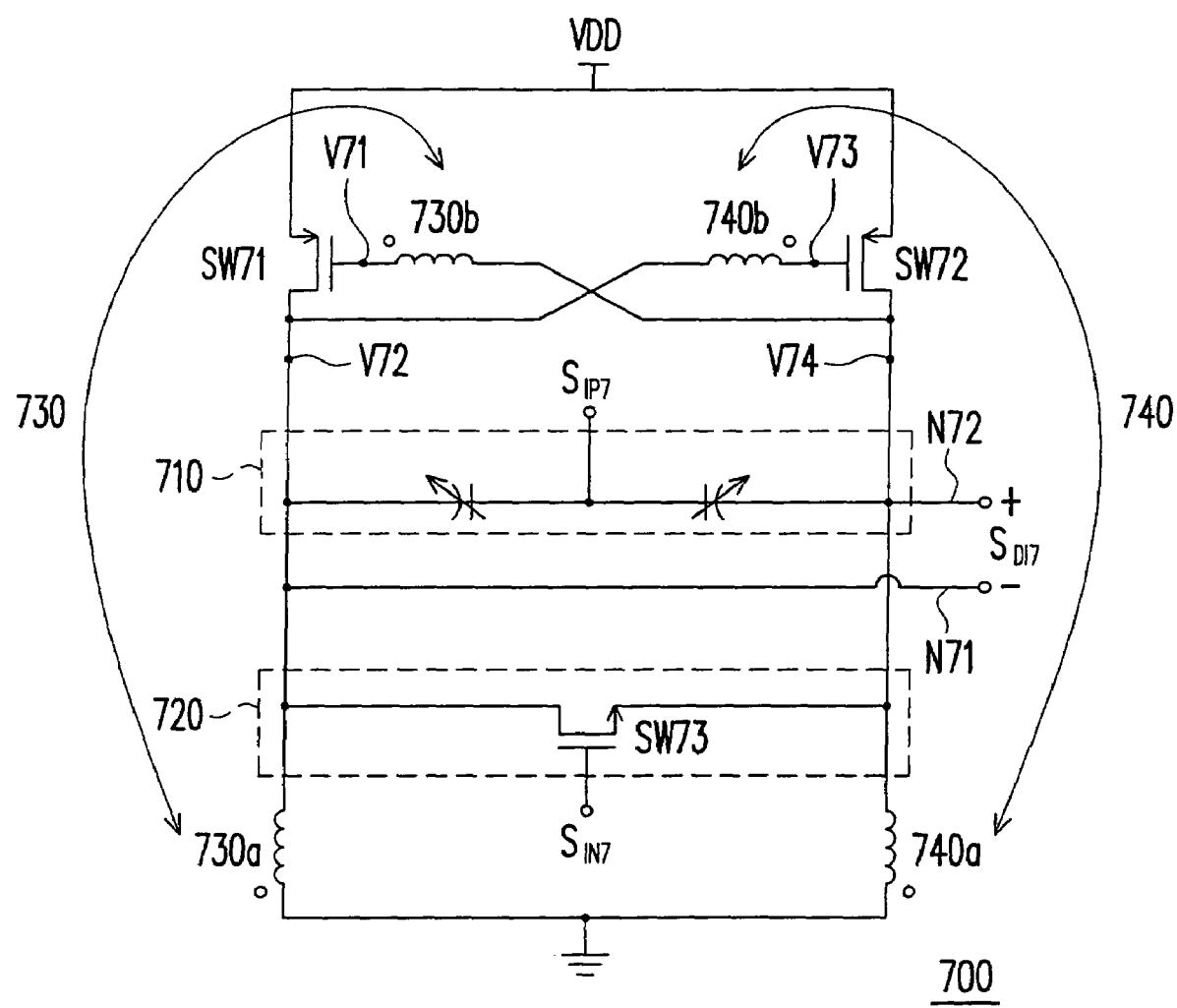
FIG. 7 is a schematic structural view of an injection-locked frequency divider according to yet another embodiment of the present invention.

From another point of view, FIG. 7 is a schematic structural view of an injection-locked frequency divider according to yet another embodiment of the present invention. Referring to FIG. 7, the injection-locked frequency divider 700 includes a variable reactance unit 710, a signal injection unit 720, switches SW71 and SW72, and transformers 730 and 740. The variable reactance unit 710 has connecting terminals N71 and N72. The signal injection unit 720 is coupled to the connecting terminals N71 and N72. The switch SW71 is coupled between the connecting terminal N71 and an operating voltage $V_{DD}$. The switch SW72 is coupled between the connecting terminal N72 and the operating voltage $V_{DD}$. A primary-side coil 730a of the transformer 730 is coupled between the connecting terminal N71 and a ground terminal, and a secondary-side coil 730b of the transformer 730 is coupled between a control terminal of the switch SW71 and the connecting terminal N72. A primary-side coil 740a of the transformer 740 is coupled between the connecting terminal N72 and the ground terminal, and a secondary-side coil 740b of the transformer 740 is coupled between a control terminal of the switch SW72 and the connecting terminal N71.

Furthermore, the variable reactance unit 710 includes variable capacitors C71 and C72, and the signal injection unit 720 includes a switch SW73. A first terminal of the variable capacitor C71 is coupled to the connecting terminal N71, a first terminal of the variable capacitor C72 is coupled to the connecting terminal N72, and a second terminal of the variable capacitor C71 and a second terminal of the variable capacitor C72 are coupled with each other. In addition, a first terminal of the switch SW73 is coupled to the connecting terminal N71 and a second terminal of the switch SW73 is coupled to the connecting terminal N72.

It should be noted that the switches SW71 and SW72 respectively include a P-type transistor, and the switch SW73 includes an N-type transistor. However, the architecture of the switches SW71-SW72 is not limited to this and those skilled in the art can replace the switches SW71-SW72 with other elements.

Referring to FIG. 7, the variable reactance unit 710, the switches SW71 and SW72, and the transformers 730 and 740 construct a transformer-based LC-tank oscillator. A resonator of the transformer-based LC-tank oscillator is constructed by the variable reactance unit 710 and the transformers 730 and 740. The switches SW71 and SW72 are cross-coupled to provide a negative resistance. Here, the negative resistance provided by the switches SW71 and SW72 compensates the parasitic resistance in the resonator, such that the transformer-based LC-tank oscillator maintains oscillation. In another aspect, a second terminal of the variable capacitor C71 receives a reactance control signal $S_{IP7}$. The variable reactance unit 710 adjusts its reactance value according to the reactance control signal $S_{IP7}$, such that the oscillation frequency of the transformer-based LC-tank oscillator changes accordingly.

During the generation of a frequency division signal $S_{DI7}$, the injection-locked frequency divider 700 receives an injection signal $S_{IN7}$ through the signal injection unit 720, wherein the frequency of the injection signal $S_{IN7}$ is denoted by $f_7$. When the oscillation frequency of the transformer-based LC-tank oscillator approaches one half of the frequency $f_7$, the injection-locked frequency divider 700 is in the locked state, and the frequency division signal $S_{DI7}$ is output through the connecting terminals N71 and N72. At this time, the frequency of the frequency division signal $S_{DI7}$ is one half of the frequency $f_7$.

It should be noted that, when a node voltage V71 decreases, a node voltage V72 not only rises with the on/off of the switch SW71, but also further rises with the feedback action of the transformer 730. Similarly, when a node voltage V73 decreases, a node voltage V74 not only rises with the on/off of the switch SW72, but also further rises with the feedback action of the transformer 740. In this manner, the injection-locked frequency divider 700 increases the locking range of its circuit by using the feedback action of the transformers 730 and 740. Under the feedback action formed of the transformers 730 and 740, the amplitude of the frequency division signal $S_{DI7}$ is efficiently enlarged, thus promoting the injection-locked frequency divider 700 operating at a low operating voltage.

Figure 8:
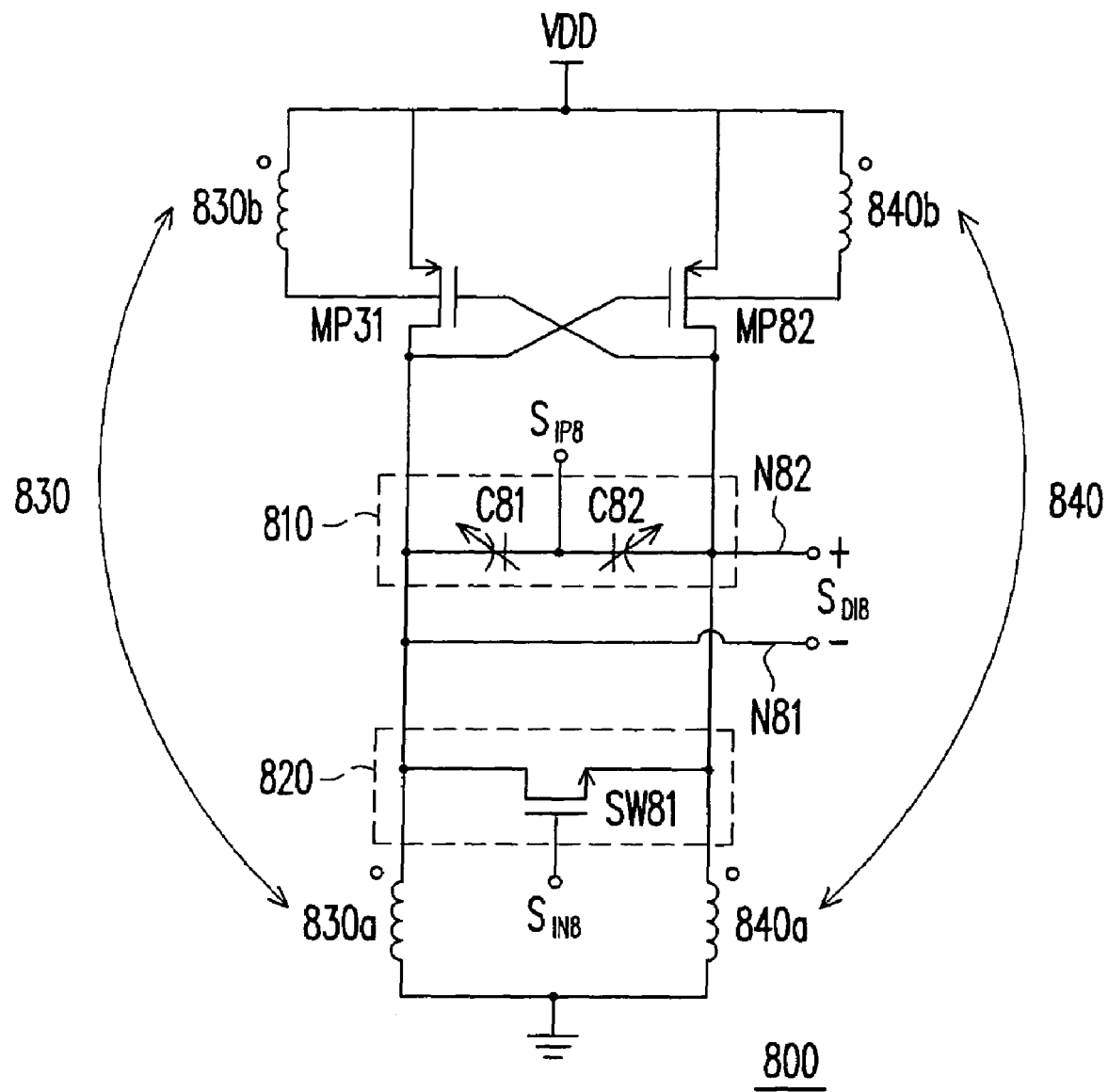
FIG. 8 is a schematic structural view of an injection-locked frequency divider according to another embodiment of the present invention.

FIG. 8 is a schematic structural view of an injection-locked frequency divider according to another embodiment of the present invention. Referring to FIG. 8, the injection-locked frequency divider 800 includes a variable reactance unit 810, a signal injection unit 820, P-type transistors MP81 and MP82, and transformers 830 and 840. The variable reactance unit 810 has connecting terminals N81 and N82. The signal injection unit 820 is coupled to the connecting terminals N81 and N82. A drain of the P-type transistor MP81 is coupled to the connecting terminal N81, a gate of the P-type transistor MP81 is coupled to the connecting terminal N82, and a source of the P-type transistor MP81 is coupled to an operating voltage $V_{DD}$. A drain of the P-type transistor MP82 is coupled to the connecting terminal N82, a gate of the P-type transistor MP82 is coupled to the connecting terminal N81, and a source of the P-type transistor MP82 is coupled to the operating voltage $V_{DD}$.

Furthermore, a primary-side coil 830a of the transformer 830 is coupled between the connecting terminal N81 and a ground terminal, and a secondary-side coil 830b of the transformer 830 is coupled between a base of the P-type transistor MP81 and the operating voltage $V_{DD}$. A primary-side coil 840b of the transformer 840 is coupled between the connecting terminal N82 and the ground terminal, and a secondary-side coil 840b of the transformer 840 is coupled between a base of the P-type transistor MP82 and the operating voltage $V_{DD}$.

Furthermore, the variable reactance unit 810 includes variable capacitors C81 and C82, and the signal injection unit 820 includes a switch SW81. A first terminal of the variable capacitor C81 is coupled to the connecting terminal N81, a first terminal of the variable capacitor C82 is coupled to the connecting terminal N82, and a second terminal of the variable capacitor C81 and a second terminal of the variable capacitor C82 are coupled with each other. A first terminal of the switch SW81 is coupled to the connecting terminal N81 and a second terminal of the switch SW81 is coupled to the connecting terminal N82. It should be noted that the switch SW81 includes an N-type transistor. However, the architecture of the switch SW81 is not limited to this, and those skilled in the art can replace the switch SW81 with other elements in accordance with the design requirements.

Referring to FIG. 8, the variable reactance unit 810, the P-type transistors MP81 and MP82, and the transformers 830 and 840 construct a transformer-based LC-tank oscillator. The resonator of the transformer-based LC-tank oscillator is constructed by the variable reactance unit 810 and the transformers 830 and 840. The P-type transistors MP81 and MP82 are cross-coupled to provide a negative resistance. The negative resistance provided by the P-type transistors MP81 and MP82 compensates the parasitic resistance in the resonator, such that the transformer-based LC-tank oscillator maintains oscillation. In another aspect, a second terminal of the variable capacitor C81 receives a reactance control signal $S_{IP8}$. The variable reactance unit 810 adjusts its reactance value according to the reactance control signal $S_{IP8}$, such that the oscillation frequency of the transformer-based LC-tank oscillator changes accordingly.

In another aspect, the signal injection unit 820 is used to receive an injection signal $S_{IN8}$, wherein the frequency of the injection signal $S_{IN8}$ is denoted by $f_8$. When the injection-locked frequency divider 800 is in the locked state, the connecting terminals N81 and N82 output a frequency division signal $S_{DI8}$, and at this time, the frequency of the frequency division signal $S_{DI8}$ is one half of the frequency $f_8$. In addition, as those described in the aforementioned embodiments, the feedback action of the transformers 830 and 840 promotes the increase of the locking range of the injection-locked frequency divider 800 and the realization of the low operating voltage.

Figure 9:
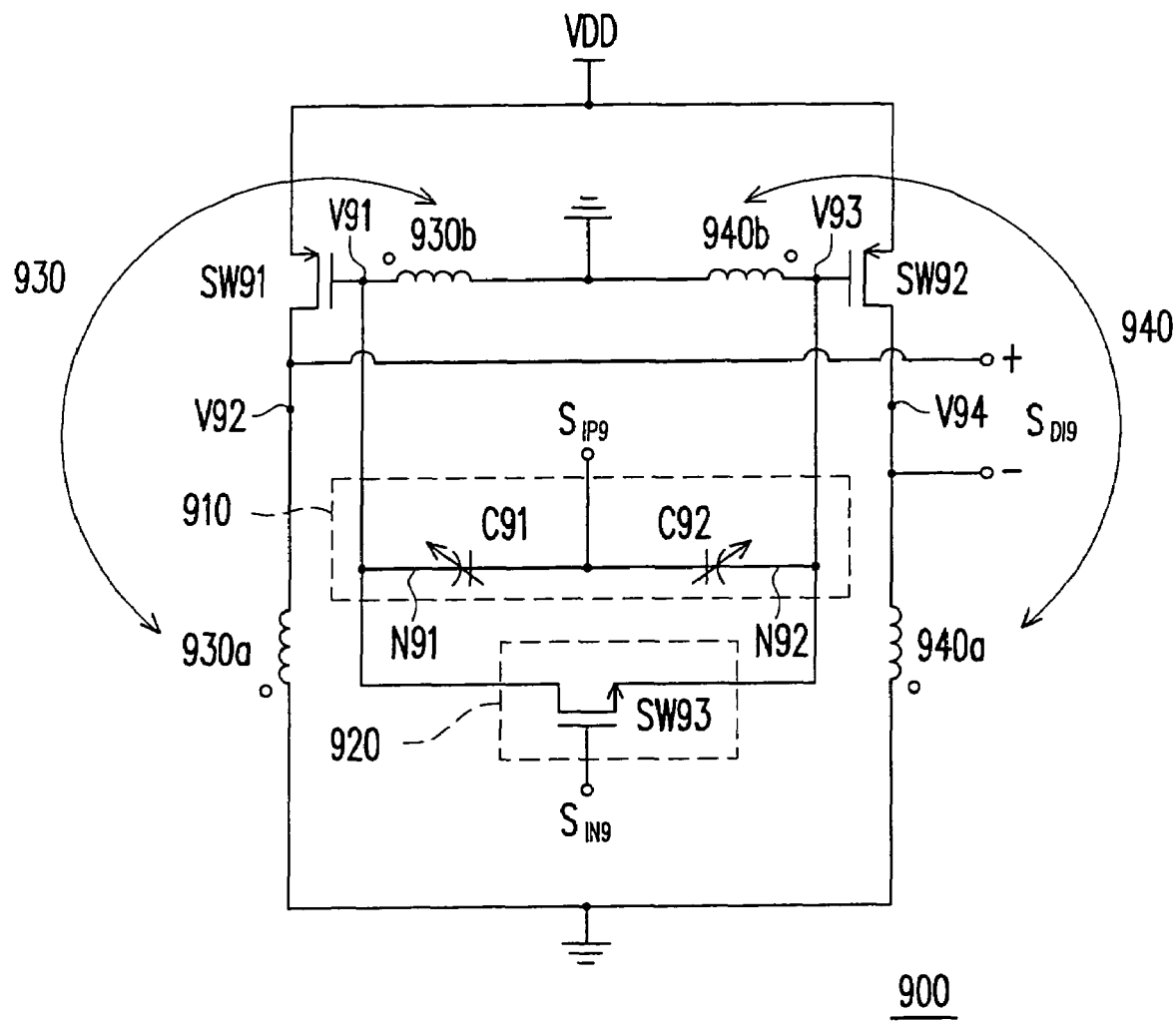
FIG. 9 is a schematic structural view of an injection-locked frequency divider according to still another embodiment of the present invention.

FIG. 9 is a schematic structural view of an injection-locked frequency divider according to still another embodiment of the present invention. Referring to FIG. 9, the injection-locked frequency divider 900 includes a variable reactance unit 910, a signal injection unit 920, switches SW91 and SW92, and transformers 930 and 940. A first terminal of the switch SW91 is used to output a frequency division signal $S_{DI9}$, and a second terminal of the switch SW91 is coupled to an operating voltage $V_{DD}$. A first terminal of the switch SW92 is used to output a frequency division signal $S_{DI9}$, and a second terminal of the switch SW92 is coupled to the operating voltage $V_{DD}$. A primary-side coil 930a of the transformer 930 is coupled between a first terminal of the switch SW91 and a ground terminal, and a secondary-side coil 930b of the transformer 930 is coupled between a control terminal of the switch SW91 and the ground terminal.

Furthermore, a primary-side coil 940a of the transformer 940 is coupled between a first terminal of the switch SW92 and the ground terminal, and a secondary-side coil 940b of the transformer 940 is coupled between a control terminal of the switch SW92 and the ground terminal. The variable reactance unit 910 has connecting terminals N91 and N92, wherein the connecting terminal N91 is coupled to the secondary-side coil 930b of the transformer 930 and the connecting terminal N92 is coupled to the secondary-side coil 940b of the transformer 940. The signal injection unit 920 is coupled to the connecting terminals N91 and N92.

Furthermore, the variable reactance unit 910 includes variable capacitors C91 and C92, and the signal injection unit 920 includes a switch SW93. A first terminal of the variable capacitor C91 is coupled to the connecting terminal N91, a first terminal of the variable capacitor C92 is coupled to the connecting terminal N92, and a second terminal of the variable capacitor C91 and a second terminal of the variable capacitor C92 are coupled with each other. A first terminal of the switch SW93 is coupled to the connecting terminal N91 and a second terminal of the switch SW93 is coupled to the connecting terminal N92.

It should be noted that the switches SW91 and SW92 respectively include a P-type transistor, and the switch SW93 includes an N-type transistor. However, the architecture of the switches SW91-SW93 is not limited to this, and those skilled in the art can replace the switches SW91-SW93 with other equivalent elements in order to achieve the purpose of the present invention, which shall be also construed to be within the scope of the present invention.

Referring to FIG. 9, in the overall operating mechanism, the variable reactance unit 910, the switches SW91 and SW92, and the transformers 930 and 940 construct a transformer-based LC-tank oscillator. The transformer-based LC-tank oscillator is also referred to as the Armstrong oscillator. The switch SW91 and the transformer 930 form a single ended Armstrong oscillator. Similarly, the switch SW92 and the transformer 940 form another single ended Armstrong oscillator. Here, the two single ended Armstrong oscillators and the variable reactance unit 910 construct a differential output Armstrong oscillators, i.e., the transform-based LC-tank oscillator.

It should be noted that a second terminal of the variable capacitor C91 receives a reactance control signal $S_{IP9}$. Thus, the variable reactance unit 910 adjusts its reactance value according to a reactance control signal $S_{IP9}$, such that the oscillation frequency of the transformer-based LC-tank oscillator changes accordingly.

In another aspect, the signal injection unit 920 is used to receive an injection signal $S_{IN9}$, wherein the frequency of the injection signal $S_{IN9}$ is $f_9$. Through a transmission path provided by the signal injection unit 920, the injection signal $S_{IN9}$ is outputted to the control terminals of the switches SW91 and SW92. At this time, when the switches SW91 and SW92 are turned on/off, the transformer-based LC-tank oscillator starts to oscillate. After that, when the injection-locked frequency divider 900 enters the locked state, the connecting terminals N91 and N92 output the frequency division signal $S_{DI9}$, wherein the frequency of the frequency division signal $S_{DI9}$ is one half of the frequency $f_9$.

It should be noted that when a node voltage V91 decreases, a node voltage V92 not only rises with the on/off of the switch SW91, but also further rises with the feedback action of the transformer 930. Similarly, when a node voltage V93 decreases, a node voltage V94 not only rises with the on/off of the switch SW92, but also further rises with the feedback action of the transformer 940. In this manner, the injection-locked frequency divider 900 increases the locking range of its circuit by using the feedback action of the transformers 930 and 940. Under the feedback action of the transformers 930 and 940, the amplitude of the frequency division signal $S_{DI9}$ is efficiently enlarged, thus promoting the injection-locked frequency divider 900 operating at a low operating voltage.

According to the embodiment described in FIG. 9, different types of injection-locked frequency dividers are derived from the injection-locked frequency divider 900 and the details will be described one by one as follows.

Figure 10:
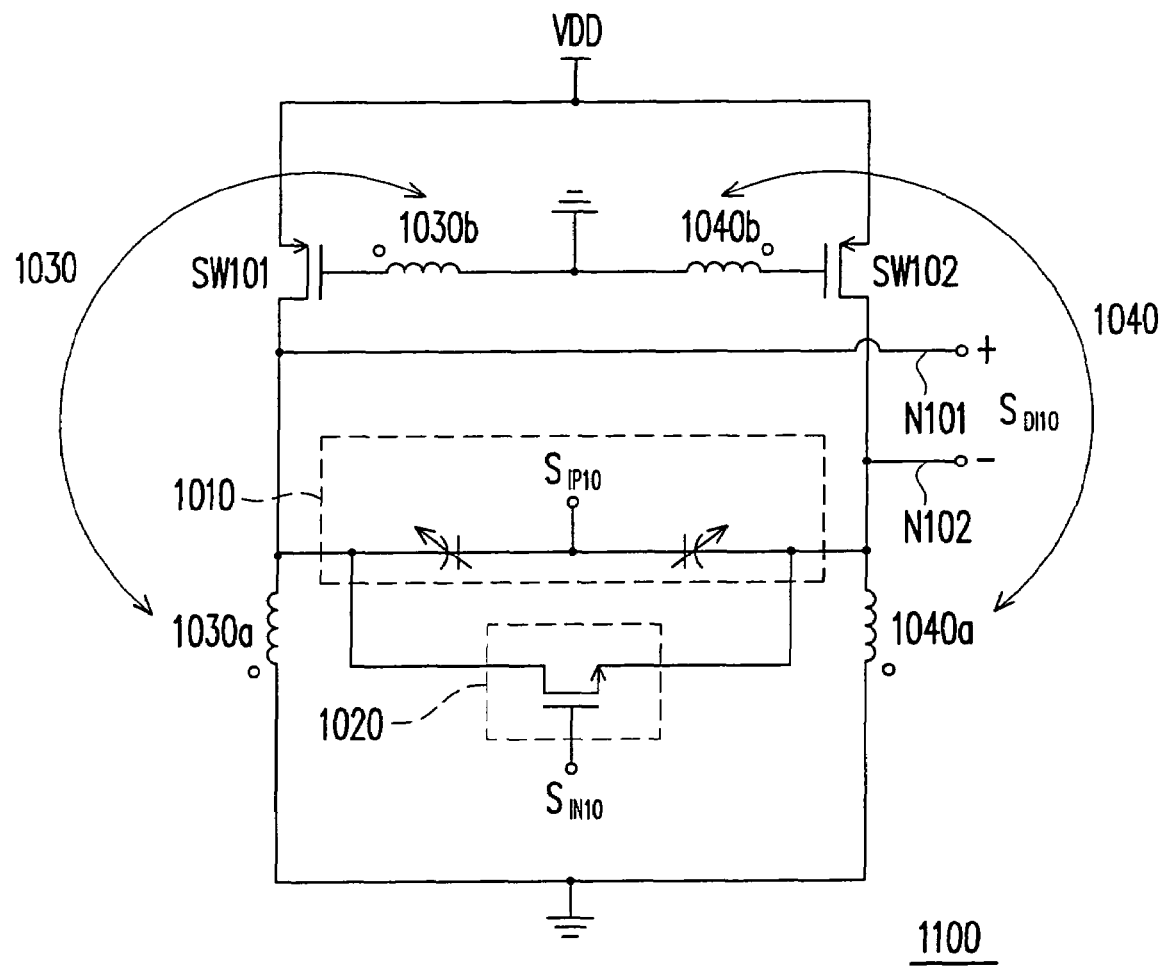
FIG. 10 is a schematic structural view of an injection-locked frequency divider derived from the embodiment of FIG. 9.

FIG. 10 is a schematic structural view of an injection-locked frequency divider derived from the embodiment of FIG. 9. Referring to FIG. 10, the injection-locked frequency divider 1100 includes a variable reactance unit 1010, a signal injection unit 1020, switches SW101 and SW102, and transformers 1030 and 1040. A first terminal of the switch SW101 is used to output a frequency division signal $S_{DI10}$, and a second terminal of the switch SW101 is coupled to an operating voltage $V_{DD}$. A first terminal of the switch SW102 is used to output the frequency division signal $S_{DI10}$, and a second terminal of the switch SW102 is coupled to the operating voltage $V_{DD}$. A primary-side coil 1030b of the transformer 1030 is coupled between the first terminal of the switch SW101 and a ground terminal, and a secondary-side coil 1030b of the transformer 1030 is coupled between a control terminal of the switch SW101 and the ground terminal.

Furthermore, a primary-side coil 1040a of the transformer 1040 is coupled between a first terminal of the switch SW 102 and the ground terminal, and a secondary-side coil 1040b of the transformer 1040 is coupled between a control terminal of the switch SW102 and the ground terminal. The variable reactance unit 1010 has connecting terminals N101 and N102, wherein the connecting terminal N101 is coupled to the primary-side coil 1030a of the transformer 1030 and the connecting terminal N102 is coupled to the primary-side coil 1040b of the transformer 1040. The signal injection unit 1020 is coupled between the connecting terminals N101 and N102. The details of the architecture and coupling relationship of other means are similar to those in the embodiment of FIG. 9 and will not be described herein again.

Referring to FIGS. 9 and 10 together, the injection-locked frequency dividers 1100 and 900 have substantially the same operating principles. The variable reactance unit 1010, the switches SW101 and SW102, and the transformers 1030 and 1040 construct a transformer-based LC-tank oscillator. The oscillation frequency of the transformer-based LC-tank oscillator changes with a reactance control signal $S_{IP10}$. When the injection-locked frequency divider 1100 is in the locked state, the connecting terminals N101 and N102 output a frequency division signal $S_{DI10}$, and at this time, the frequency of the frequency division signal $S_{DI10}$ is one half of the frequency of an injection signal $S_{IN10}$.

However, the main difference between the injection-locked frequency dividers 1100 and 900 lies in that the connecting terminals N101 and N102 of the injection-locked frequency divider 1100 are coupled to the primary-side coils of the transformers 1030 and 1040 respectively, and the connecting terminals N91 and N92 of the injection-locked frequency divider 900 are coupled to the secondary-side coils of the transformers 930 and 940 respectively. However, in the embodiment of FIG. 10, the injection-locked frequency divider 1100 increases the locking range and realizes a low operating voltage still by using the feedback action of the transformers 1030 and 1040. Other details of the embodiment of FIG. 10 have been illustrated in the embodiment of FIG. 9, and will not be described herein again.

Figure 11:
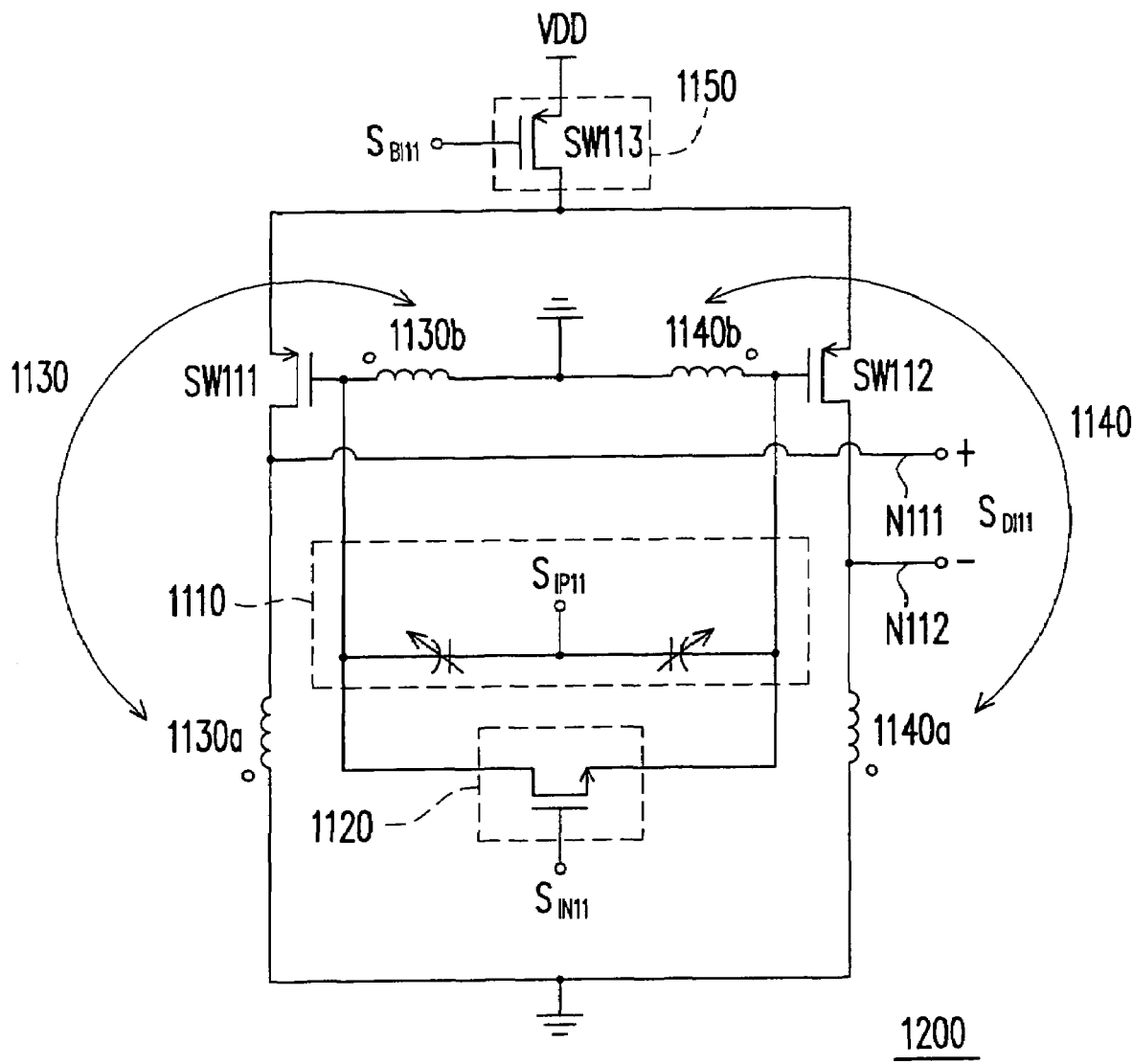
FIG. 11 is a schematic structural view of another injection-locked frequency divider derived from the embodiment of FIG. 9.

FIG. 11 is a schematic structural view of another injection-locked frequency divider derived from the embodiment of FIG. 9. Referring to FIG. 11, an injection-locked frequency divider 1200 includes a variable reactance unit 1110, a signal injection unit 1120, switches SW111 and SW112, transformers 1130 and 1140, and a current-limiting unit 1150. A first terminal of the switch SW111 is used to output a frequency division signal $S_{DI11}$, and a second terminal of the switch SW111 is coupled to the current-limiting unit 1150. A first terminal of the switch SW112 is used to output the frequency signal $S_{DI11}$, and a second terminal of the switch SW112 is coupled to the current-limiting unit 1150. A primary-side coil 1130a of the transformer 1130 is coupled between the first terminal of the switch SW111 and a ground terminal, and a secondary-side coil 1130b of the transformer 1130 is coupled between a control terminal of the switch SW111 and the ground terminal.

Furthermore, a primary-side coil 1140a of the transformer 1140 is coupled between the first terminal of the switch SW112 and the ground terminal, and a secondary-side coil 1140b is coupled between a control terminal of the switch SW112 and the ground terminal. The variable reactance unit 1110 has connecting terminals N111 and N112, wherein the connecting terminal N111 is coupled to the secondary-side coil 1130b of the transformer 1130 and the connecting terminal N112 is coupled to the secondary-side coil 1140b of the transformer 1140. The signal injection unit 1120 is coupled to the connecting terminals N111 and N112. The current-limiting unit 1150 is coupled to an operating voltage $V_{DD}$, a second terminal of the switch SW111, and a second terminal of the switch SW112.

Furthermore, the current-limiting unit 1150 includes a switch SW113. A first terminal of the switch SW113 is coupled to the second terminals of the switches SW111 and SW112, the second terminal of the switch SW113 is coupled to the operating voltage $V_{DD}$, and the control terminal of the switch SW113 is used to receive a bias current control signal $S_{BI1}$. It should be noted that the switch SW113 includes a P-type transistor, but the architecture of the switch SW113 is not limited to this. Those skilled in the art can replace the switch SW113 with other elements in accordance with the design requirements. The details of the architecture and coupling relationship of other means are similar to those of the embodiment of FIG. 9 and will not be described herein again.

Referring to FIGS. 9 and 11 together, the injection-locked frequency dividers 1200 and 900 have substantially the same operating principles. The variable reactance unit 1110, the switches SW111 and SW112, and the transformers 1130 and 1140 construct a transformer-based LC-tank oscillator. The oscillation frequency of the transformer-based LC-tank oscillator changes with a reactance control signal $S_{IP11}$. When the injection-locked frequency divider 1200 is in the locked state, the connecting terminals N111 and N112 output a frequency division signal $S_{DI11}$, and at this times, the frequency of the frequency division signal $S_{DI11}$ is one half of the frequency of an injection signal $S_{IN11}$.

The main difference between the injection-locked frequency dividers 1200 and 900 lies in that the current-limiting unit 1150 is further added in the injection-locked frequency divider 1200. At this time, the current-limiting unit 1150 adjusts and controls a current flowing through the injection-locked frequency divider 1200 according to the bias current control signal $S_{BI11}$. In this manner, the power consumption of the injection-locked frequency divider 1200 can be efficiently reduced. Other details of the embodiment of FIG. 11 have been illustrated in the embodiment of FIG. 9, and will not be described herein again.

In view of the above, by employing transformers coupled in various manners, the present invention can increase the locking range of the injection-locked frequency divider. Furthermore, due to the feedback action of the transformers, the injection-locked frequency divider of the present invention has a low operating voltage, and is suitable to be applied in various mixed signal integrated circuits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An injection-locked frequency divider, suitable for performing a frequency division action on an injection signal to generate a frequency division signal, comprising:
   a variable reactance unit, having a first connecting terminal and a second connecting terminal, for adjusting a reactance value of the injection-locked frequency divider and outputting the frequency division signal through the first connecting terminal and the second connecting terminal;
   a signal injection unit, coupled to the first connecting terminal and the second connecting terminal, for receiving the injection signal;
   a first switch, with a first terminal coupled to the first connecting terminal and a control terminal coupled to the second connecting terminal;
   a second switch, with a first terminal coupled to the second connecting terminal and a control terminal coupled to the first connecting terminal;
   a first transformer, having a primary-side coil and a secondary-side coil, the primary-side coil of the first transformer being coupled between the first connecting terminal and a ground terminal, and the secondary-side coil of the first transformer being coupled between the second terminal of the first switch and an operating voltage; and
   a second transformer, having a primary-side coil and a secondary-side coil, the primary-side coil of the second transformer being coupled between the second connecting terminal and the ground terminal, and the secondary-side coil of the second transformer being coupled between the second terminal of the second switch and the operating voltage.

2. The injection-locked frequency divider as claimed in claim 1, wherein the variable reactance unit comprises:
   a first variable capacitor, with a first terminal coupled to the first connecting terminal; and
   a second variable capacitor, with a first terminal coupled to the second connecting terminal and a second terminal coupled to a second terminal of the first variable capacitor.

3. The injection-locked frequency divider as claimed in claim 2, wherein the second terminal of the first variable capacitor receives a reactance control signal and the variable reactance unit adjusts its reactance value according to the reactance control signal.

4. The injection-locked frequency divider as claimed in claim 1, wherein the signal injection unit comprises:
   a third switch, with a first terminal coupled to the first connecting terminal, a second terminal coupled to the second connecting terminal, and a control terminal for receiving the injection signal.

5. The injection-locked frequency divider as claimed in claim 4, wherein the third switch comprises an N-type transistor.

6. The injection-locked frequency divider as claimed in claim 1, further comprising:
   a current-limiting unit, coupled to the operating voltage, the secondary-side coil of the first transformer, and the secondary-side coil of the second transformer, so as to adjust and control a current flowing through the injection-locked frequency divider.

7. The injection-locked frequency divider as claimed in claim 6, wherein the current-limiting unit comprises:
   a fourth switch, with a first terminal coupled to the secondary-side coil of the first transformer and the secondary-side coil of the second transformer, a second terminal coupled to the operating voltage, and a control terminal for receiving a bias current control signal, wherein the fourth switch adjusts and controls a current flowing through the injection-locked frequency divider according to the bias current control signal.

8. The injection-locked frequency divider as claimed in claim 7, wherein the fourth switch comprises a P-type transistor.

9. The injection-locked frequency divider as claimed in claim 1, wherein the first switch and the second switch respectively comprise a P-type transistor.

10. The injection-locked frequency divider as claimed in claim 1, wherein the frequency of the injection signal is twice the frequency of the frequency division signal.

11. An injection-locked frequency divider, suitable for performing a frequency division action on an injection signal to generate a frequency division signal, comprising:
    a variable reactance unit, having a first connecting terminal and a second connecting terminal, for adjusting a reactance value of the injection-locked frequency divider and outputting the frequency division signal through the first connecting terminal and the second connecting terminal;

a signal injection unit, coupled to the first connecting terminal and the second connecting terminal, for receiving the injection signal;

a first switch, coupled between the first connecting terminal and an operating voltage;

a second switch, coupled between the second connecting terminal and the operating voltage;

a first transformer, having a primary-side coil and a secondary-side coil, the primary-side coil of the first transformer being coupled between the first connecting terminal and a ground terminal, and the secondary-side coil of the first transformer being coupled between the control terminal of the first switch and the second connecting terminal; and a second transformer, having a primary-side coil and a secondary-side coil, the primary-side coil of the second transformer being coupled between the second connecting terminal and the ground terminal, and the secondary-side coil of the second transformer being coupled between the control terminal of the second switch and the first connecting terminal.

12. The injection-locked frequency divider as claimed in claim 11, wherein the variable reactance unit comprises:

a first variable capacitor, with a first terminal coupled to the first connecting terminal; and a second variable capacitor, with a first terminal coupled to the second connecting terminal and a second terminal coupled to a second terminal of the first variable capacitor.

13. The injection-locked frequency divider as claimed in claim 12, wherein a second terminal of the first variable capacitor receives a reactance control signal, and the variable reactance unit adjusts its reactance value according to the reactance control signal.

14. The injection-locked frequency divider as claimed in claim 11, wherein the signal injection unit comprises:

a third switch, with a first terminal coupled to the first connecting terminal, a second terminal coupled to the second connecting terminal, and a control terminal for receiving the injection signal.

15. The injection-locked frequency divider as claimed in claim 14, wherein the third switch comprises an N-type transistor.

16. The injection-locked frequency divider as claimed in claim 11, wherein the first switch and the second switch respectively comprise a P-type transistor.

17. The injection-locked frequency divider as claimed in claim 11, wherein the frequency of the injection signal is twice the frequency of the frequency division signal.

18. An injection-locked frequency divider, suitable for performing a frequency division action on an injection signal to generate a frequency division signal, comprising:

a variable reactance unit, having a first connecting terminal and a second connecting terminal, for adjusting a reactance value of the injection-locked frequency divider and outputting the frequency division signal through the first connecting terminal and the second connecting terminal;

a signal injection unit, coupled to the first connecting terminal and the second connecting terminal, so as to receive the injection signal;

a first P-type transistor, with a drain coupled to the first connecting terminal, a gate coupled to the second connecting terminal, and a source coupled to an operating voltage;

a second P-type transistor, with a drain coupled to the second connecting terminal, a gate coupled to the first connecting terminal, and a source coupled to the operating voltage;

a first transformer, having a primary-side coil and a secondary-side coil, the primary-side coil of the first transformer being coupled between the first connecting terminal and a ground terminal, the secondary-side coil of the first transformer being coupled between a base of the first P-type transistor and the operating voltage; and a second transformer, having a primary-side coil and a secondary-side coil, the primary-side coil of the second transformer being coupled between the second connecting terminal and the ground terminal, the secondary-side coil of the second transformer being coupled between a base of the second P-type transistor and the operating voltage.

19. The injection-locked frequency divider as claimed in claim 18, wherein the variable reactance unit comprises:

a first variable capacitor, with a first terminal coupled to the first connecting terminal; and a second variable capacitor, with a first terminal coupled to the second connecting terminal and a second terminal coupled to a second terminal of the first variable capacitor.

20. The injection-locked frequency divider as claimed in claim 19, wherein the second terminal of the first variable capacitor receives a reactance control signal and the variable reactance unit adjusts its reactance value according to the reactance control signal.

21. The injection-locked frequency divider as claimed in claim 18, wherein the signal injection unit comprises:

a switch, with a first terminal coupled to the first connecting terminal, a second terminal coupled to the second connecting terminal, and a control terminal for receiving the injection signal.

22. The injection-locked frequency divider as claimed in claim 21, wherein the switch comprises an N-type transistor.

23. The injection-locked frequency divider as claimed in claim 18, wherein the frequency of the injection signal is twice the frequency of the frequency division signal.

24. An injection-locked frequency divider, suitable for performing a frequency division action on an injection signal to generate a frequency division signal, comprising:

a first switch, with a first terminal for outputting the frequency division signal and a second terminal coupled to an operating voltage;

a second switch, with a first terminal for outputting the frequency division signal and a second terminal coupled to the operating voltage;

a first transformer, having a primary-side coil and a secondary-side coil, the primary-side coil of the first transformer being coupled between the first terminal of the first switch and a ground terminal, and the secondary-side coil of the first transformer being coupled between the control terminal of the first switch and the ground terminal;

a second transformer, having a primary-side coil and a secondary-side coil, the primary-side coil of the second transformer being coupled between the first terminal of the second switch and the ground terminal, and the secondary-side coil of the second transformer being coupled between the control terminal of the second switch and the ground terminal;

a variable reactance unit, having a first connecting terminal and a second connecting terminal, the first connecting terminal being coupled to the first transformer and the second connecting terminal being coupled to the second transformer, and being used to adjust a reactance value of the injection-locked frequency divider; and a signal injection unit, coupled to the first connecting terminal and the second connecting terminal, so as to receive the injection signal.

25. The injection-locked frequency divider as claimed in claim 24, wherein when the first connecting terminal is coupled to the primary-side coil of the first transformer, the second connecting terminal is coupled to the primary-side coil of the second transformer.

26. The injection-locked frequency divider as claimed in claim 24, wherein when the first connecting terminal is coupled to the secondary-side coil of the first transformer, the second connecting terminal is coupled to the secondary-side coil of the second transformer.

27. The injection-locked frequency divider as claimed in claim 24, wherein the variable reactance unit comprises:
a first variable capacitor, with a first terminal coupled to the first connecting terminal; and
a second variable capacitor, with a first terminal coupled to the second connecting terminal and a second terminal coupled to a second terminal of the first variable capacitor.

28. The injection-locked frequency divider as claimed in claim 27, wherein the second terminal of the first variable capacitor receives a reactance control signal and the variable reactance unit adjusts its reactance value according to the reactance control signal.

29. The injection-locked frequency divider as claimed in claim 24, wherein the signal injection unit comprises:

a third switch, with a first terminal coupled to the first connecting terminal, a second terminal coupled to the second connecting terminal, and a control terminal for receiving the injection signal.

30. The injection-locked frequency divider as claimed in claim 29, wherein the third switch comprises an N-type transistor.

31. The injection-locked frequency divider as claimed in claim 24, further comprising:
a current-limiting unit, coupled to the operating voltage, the second terminal of the first switch, and the second terminal of the second switch, for adjusting and controlling a current flowing through the injection-locked frequency divider.

32. The injection-locked frequency divider as claimed in claim 31, wherein the current-limiting unit comprises:
a fourth switch, with a first terminal coupled to the second terminal of the first switch and the second terminal of the second switch, a second terminal coupled to the operating voltage, and a control terminal is adopted for receiving a bias current control signal, and wherein the fourth switch adjusts and controls a current flowing through the injection-locked frequency divider according to the bias current control signal.

33. The injection-locked frequency divider as claimed in claim 32, wherein the fourth switch comprises a P-type transistor.

34. The injection-locked frequency divider as claimed in claim 24, wherein the first switch and the second switch respectively comprise a P-type transistor.

35. The injection-locked frequency divider as claimed in claim 24, wherein the frequency of the injection signal is twice the frequency of the frequency division signal.

* * * * *